(12) United States Patent
Hu

(10) Patent No.: US 7,332,945 B2
(45) Date of Patent: Feb. 19, 2008

(54) DIVIDER HAVING DUAL MODULUS PRE-SCALER AND AN ASSOCIATED METHOD

(75) Inventor: Wei Hu, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 30 days.

(21) Appl. No.: 11/185,205

(22) Filed: Jul. 19, 2005

(65) Prior Publication Data

US 2006/0017473 A1    Jan. 26, 2006

(30) Foreign Application Priority Data

Jul. 22, 2004    (KR) ................. 10-2004-0057202

(51) Int. Cl.
*H03K 00/25* (2006.01)

(52) U.S. Cl. ......................... 327/115; 377/47

(58) Field of Classification Search ........ 327/113–115, 327/117–118; 377/47–48
See application file for complete search history.

(56) References Cited

U.S. PATENT DOCUMENTS

| | | | |
|---|---|---|---|
| 4,184,068 A * | 1/1980 | Washburn ..................... 377/44 |
| 4,633,194 A * | 12/1986 | Kikuchi et al. ................ 331/25 |
| 4,716,308 A * | 12/1987 | Matsuo et al. .............. 326/121 |
| 4,991,187 A | 2/1991 | Herold et al. ................. 377/48 |
| 5,572,168 A * | 11/1996 | Kasturia ......................... 331/2 |
| 5,783,846 A * | 7/1998 | Baukus et al. .............. 257/204 |
| 5,841,302 A * | 11/1998 | Ishii et al. ................... 327/117 |
| 5,878,101 A * | 3/1999 | Aisaka .......................... 377/47 |
| 5,889,416 A * | 3/1999 | Lovett ........................ 326/121 |
| 6,094,466 A * | 7/2000 | Yang et al. .................... 377/47 |
| 6,411,669 B1 * | 6/2002 | Kim ............................. 377/48 |
| 6,614,870 B1 * | 9/2003 | Miller ........................... 377/48 |
| 6,696,857 B1 | 2/2004 | Rana ........................... 326/46 |
| 6,952,121 B1 * | 10/2005 | Vu ............................. 327/115 |
| 7,142,400 B1 * | 11/2006 | Williams et al. .............. 361/18 |
| 2004/0085139 A1 * | 5/2004 | Choi .......................... 331/1 A |

FOREIGN PATENT DOCUMENTS

| JP | 04-151912 | 5/1992 |
|---|---|---|
| KR | 1994-0011435 | 12/1994 |
| KR | 2001-0107134 | 12/2001 |

OTHER PUBLICATIONS

English language abstract of Japanese Publication No. 04-151912.
Ki-Hyuk Sung and Lee-Sup Kim, "A Nor-Type High-Speed Dual-Modulus Prescaler," Mar. 2000, pp. 69-76.

* cited by examiner

*Primary Examiner*—Kenneth B. Wells
*Assistant Examiner*—Thomas J. Hiltunen
(74) *Attorney, Agent, or Firm*—Marger Johnson & McCollom, P.C.

(57) ABSTRACT

We describe a dual modulus prescaler that may be used in a high frequency PLL. The prescaler comprises a frequency division unit to generate a prescaled signal by dividing a frequency of an input signal by a division ratio and a frequency division ratio controller to determine the division ratio responsive to a count signal and the prescaled signal. The frequency division unit divides a frequency of an input signal by a division ratio of 2N or (2N−1) to output a prescaled signal. The frequency division ratio controller determines a division ratio responsive to a count signal and the prescaled signal.

20 Claims, 7 Drawing Sheets

DIVIDER HAVING DUAL MODULUS PRE-SCALER AND AN ASSOCIATED METHOD

CLAIM FOR PRIORITY

This application claims priority from Korean Patent Application Number 2004-57202, filed Jul. 22, 2004 in the Korean Intellectual Property Office (KIPO). We incorporate the 2004-57202 application by reference.

BACKGROUND

1. Field

We describe a frequency divider and, more particularly, a frequency divider with a high speed dual modulus prescaler and an associated method.

2. Related Art

Frequency divider circuits are part of frequency synthesizers. In Radio Frequency (RF) systems, frequency synthesizers generate a local oscillator's frequency to step up or step down a frequency band.

Frequency synthesizers usually include a Phase Lock Loop (PLL), and generate a frequency different from the frequency of an input signal. The PLL is a basic building block of modern electronic systems. As shown in FIG. 1, the PLL circuit includes a phase/frequency detector 100, a charge pump 200, a loop filter 300, a Voltage Controlled Oscillator (VCO) 400, and a frequency divider 500.

The phase/frequency detector 100 generates an up-signal SUP and/or down-signal SDN based on a phase difference between a reference signal SIN and a feedback signal SFEED. The charge pump 200 outputs a signal having a level determined by a state of the up-signal SUP and/or the down-signal SDN. The loop filter 300 removes a high frequency component of the signal provided by the charge pump 200, and provides the input voltage VLF to the VCO 400. The VCO 400 outputs a high frequency signal having a frequency determined by the direct current level of the input voltage VLF. The frequency divider 500 generates the feedback signal SFEED having a low frequency based on the VCO output signal SOUT. The phase/frequency detector receives the feedback signal SFEED from the divider 500.

Downstream circuitry (not shown) use the VCO 400 output signal SOUT for various applications after the PLL circuit is locked. Many embodiments of the frequency divider 500 shown in FIG. 1 currently exist. For example, U.S. Pat. No. 6,696,857 describes the frequency divider shown in FIG. 2. Referring to FIGS. 1 and 2, dual modulus prescaler includes D flip-flops 12 and 14, NMOS transistors MN1 and MN2, a PMOS transistor MP1, and a NAND gate 21.

The dual modulus prescaler of FIG. 2 receives an output signal SOUT from VCO 400 as an input signal to divide the frequency of the output signal SOUT by 4 or 3, and outputs the feedback signal SFEED.

The output signal SOUT clocks the D flip-flops 12 and 14, respectively. The NAND gate 21, the NMOS transistors MN1 and MN2, and the PMOS transistor MP1 control the frequency division ratio of the dual modulus prescaler. When a mode signal MODE has a logic level '0', an output signal of the NAND gate 21 has a logic level '1'. As a result, the NMOS transistor MN1 is on and a node B has a logic level '0'. At this time, the NMOS transistor MN2 is off, and a node C is not at GND. Accordingly, the D flip-flops 12 and 14 of the dual modulus prescaler divide the frequency of the input signal by 4.

When a mode signal MODE has a logic level '1,' on the other hand, and the output signal SFEED of the D flip-flop 14 has a logic level '1', the output signal of the NAND gate 21 has an logic level '0' and the NMOS transistor MN1 is off. When an inverted output signal of the D flip-flop 14 has a logic level '0', the PMOS transistor MP1 is on, and node B has a logic level '1' that turns on the NMOS transistor MN2. The node C, therefore, is at GND. As a result, the D flip-flops 12 and 14 of the dual modulus prescaler divide the frequency of the input signal by 3. The frequency divider shown in FIG. 2 operates at a speed dependent on the dual modulus prescaler.

The frequency divider's operating speed depends on a delay time associated with the NAND gate 21 and the NMOS transistors MN1 and MN2, since these components together with the PMOS transistor MP1 control the frequency division ratio. The delay time is related to the time until the output signal SFEED of the D flip-flop 14 and the mode signal MODE reach a node C.

The dual modulus prescaler of FIG. 2 is not suitable for a PLL system operating at a high frequency, e.g., in the range of 1 to 10 GHz due to the delay times of the NAND gate 21 and the NMOS transistors MN1 and MN2.

Accordingly, a need remains for a frequency divider having a dual modulus prescaler capable of operating at high frequencies.

SUMMARY

We describe a frequency divider including a dual modulus prescaler that seeks to overcome limitations and disadvantages associated with the related art.

We describe a dual modulus prescaler comprising a frequency division unit to generate a prescaled signal by dividing a frequency of an input signal by a division ratio and a frequency division ratio controller to determine the division ratio responsive to a count signal and the prescaled signal.

The input signal may be generated by a voltage-controlled oscillator.

The division ratio may be one of 2N and 2N−1, where N is an integer.

The frequency division unit comprises N D flip-flops.

The input signal is adapted to clock the D flip-flops.

The frequency division ratio controller comprises at least two serially connected transistors.

The frequency division ratio controller comprises a first NMOS transistor having a drain coupled to an output terminal of a first stage flip-flop in the frequency division unit and a gate to receive either the count signal or the prescaled signal. And a second NMOS transistor has a drain coupled to a source of the first NMOS transistor, a gate to receive the prescaled signal, and a source coupled to a second power supply voltage.

The frequency division ratio controller comprises a first PMOS transistor having a drain coupled to an output terminal of a first stage flip-flop in the frequency division unit and a gate to receive either the count signal or the prescaled signal. And a second PMOS transistor has a drain coupled to a source of the first PMOS transistor, a gate to receive the prescaled signal, and a source coupled to a first power supply voltage.

The count signal may be generated responsive to the prescaled signal.

And we describe a prescaling method of a dual modulus prescaler comprising dividing a frequency of an input signal by a first division ratio responsive to a control signal and a prescaled signal, dividing the prescaled signal by a second division ratio to output the divided signal, and changing a state of the control signal after a predetermined number of clock pulses are generated responsive to the prescaled signal.

BRIEF DRAWINGS DESCRIPTION

The above and other features and advantages of the present invention will become more apparent by describing in detail example embodiments thereof with reference to the following drawings.

DETAILED DESCRIPTION

Figure 1:
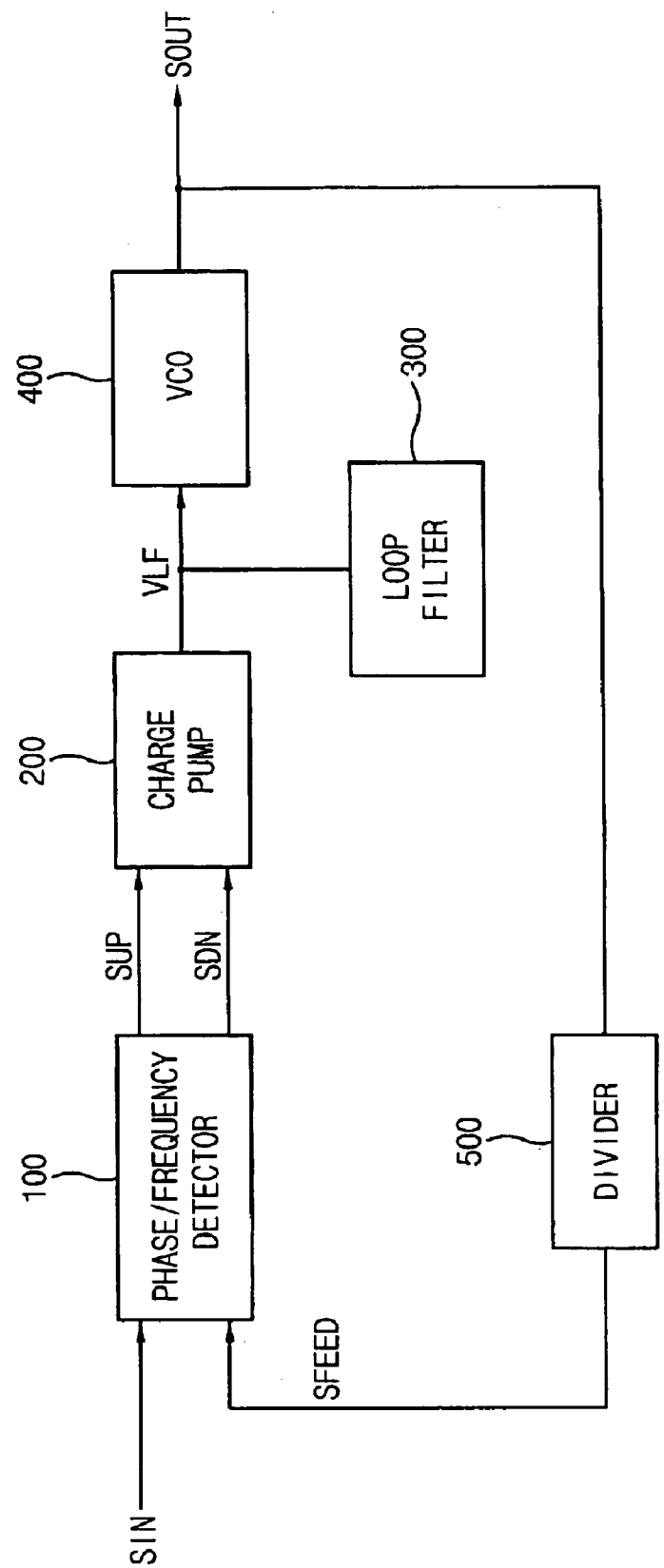
FIG. 1 is a block diagram illustrating a conventional phase locked loop PLL circuit.

We detail illustrative embodiments in the following description. Our intention is that specific structural and functional details are merely representative of example embodiments. The frequency divider may have many alternate forms and should not be construed as limited to the embodiments set forth here.

Accordingly, while the frequency divider is susceptible to various modifications and alternative forms, specific embodiments are shown by way of example in the drawings. It should be understood, however, that there is no intent to limit the frequency divider to the particular forms disclosed, but on the contrary, to cover all modifications, equivalents, and alternatives falling within the spirit and scope of the claims. Like numbers in the various drawings refer to like elements in the description.

Figure 3:
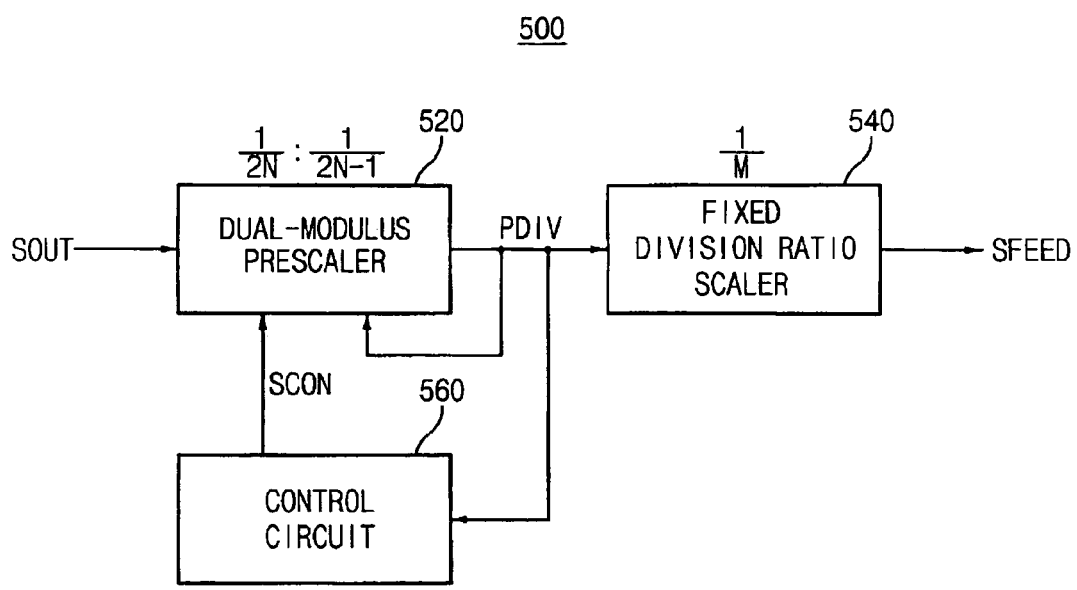
FIG. 3 is a block diagram illustrating a frequency divider according to an example embodiment of the present invention.

FIG. 3 is a block diagram of an embodiment of a frequency divider. Referring to FIG. 3, the frequency divider 500 includes a dual modulus prescaler 520, a fixed division ratio scaler 540, and a control circuit 560. The dual modulus prescaler 520 receives a signal SOUT output from a VCO (not shown). The prescaler 520 divides the frequency of the output signal SOUT by 2N or 2N−1 under the control of a control signal SCON and a prescaled signal PDIV. The fixed division ratio scaler 540 divides the frequency of the prescaled signal PDIV by a predetermined division ratio 1/M and outputs a feedback signal SFEED. The control circuit 560 counts the number of rising edges of the prescaled signal PDIV. The control circuit 560 generates the control signal SCON having a first level, e.g. high, when the number of counted clock pulses reaches a predetermined value. The control circuit 560 provides the control signal SCON to the dual modulus prescaler 520. The control circuit 560 may determine a division ratio of the dual modulus prescaler 520 and may include a counter. For example, the division ratio of the dual modulus prescaler 520 is 2N when the control signal SCON has a low level and the division ratio of the dual modulus prescaler 520 is 2N−1 when the control signal SCON has a high level.

The frequency divider 500 shown in FIG. 3 operates as follows.

An output signal of a PLL circuit, e.g., a signal SOUT output from a VCO is divided by the frequency divider 500. The dual modulus prescaler 520 divides the frequency of the output signal SOUT by a division ratio 2N when the control signal SCON has a low level or the dual modulus prescaler 520 divides the frequency of the output signal SOUT by a division ratio 2N−1 when the control signal SCON has a high level.

The 1/(2N) or 1/(2N−1) prescaled output signal PDIV from the dual modulus prescaler 520 is scaled by a predetermined division ratio M by the fixed division ratio scaler 540.

Figure 4:
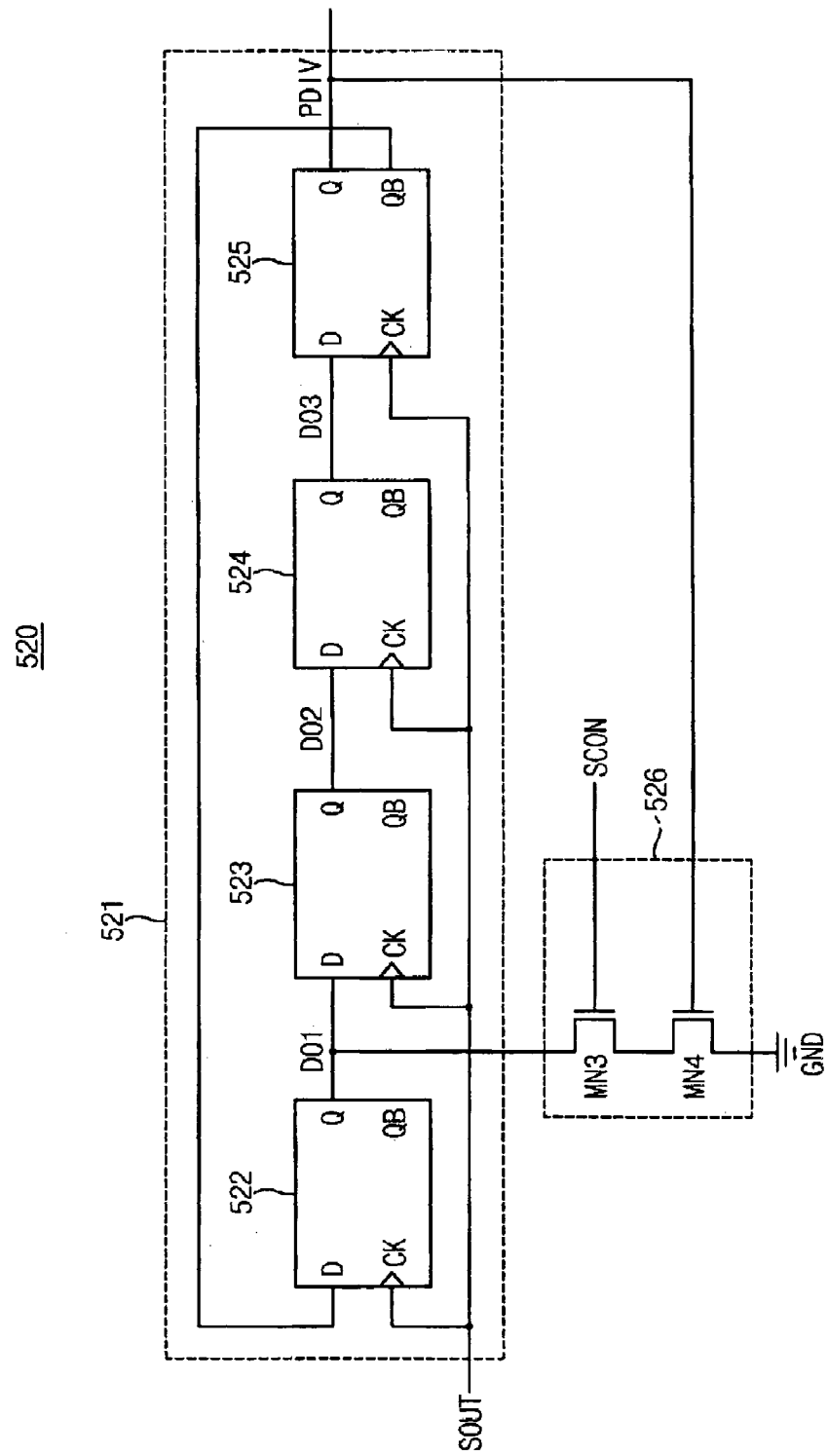
FIG. 4 is a circuit diagram illustrating a dual modulus prescaler included in the frequency divider of FIG. 3 according to an example embodiment of the present invention.

FIG. 4 is a circuit diagram of an embodiment of a dual modulus prescaler 520 shown in the frequency divider of FIG. 3. Referring to FIG. 4, a dual modulus prescaler 520 includes a frequency division unit 521 and a frequency division ratio controller 526. The frequency division unit 521 may include a plurality N of D flip-flops, where N is a natural number larger than or equal to 2. For example, the frequency division unit 521 may include four D flip-flops 522, 523, 524 and 525 as shown in FIG. 4. A VCO output signal SOUT is inputted to each of the clock terminals CK of the D flip-flops 522 to 525. The signal SOUT, therefore, clocks the D flip-flops 522 to 525.

An output signal D01 of the first D flip-flop 522 is applied to an input terminal D of the second D flip-flop 523, an output signal D02 of the second D flip-flop 523 is applied to an input terminal D of the third D flip-flop 524 and an output signal D03 of the third D flip-flop 524, is applied to an input terminal D of the fourth D flip-flop 525.

The output signal PDIV is output from the terminal of the fourth D flip-flop 525 of the frequency division unit 521 is outputted from an output terminal Q of the fourth D flip-flop 525. An output signal from an inverted output terminal QB of the fourth D flip-flop 525 is fed back into the input terminal D of the first D flip-flop 522.

The frequency division ratio controller 526 includes serially connected NMOS transistors MN3 and MN4. The NMOS transistor MN3 includes a drain coupled to the output terminal Q of the first D flip-flop 522 and a gate coupled to receive the control signal SCON from the control circuit 560 (FIG. 3). The NMOS transistor MN4 includes a drain coupled to a source of the NMOS transistor MN3, a gate coupled to receive the PDIV signal from the output terminal Q of the fourth D flip-flop 525, and a source coupled to a ground voltage GND.

Figure 2:
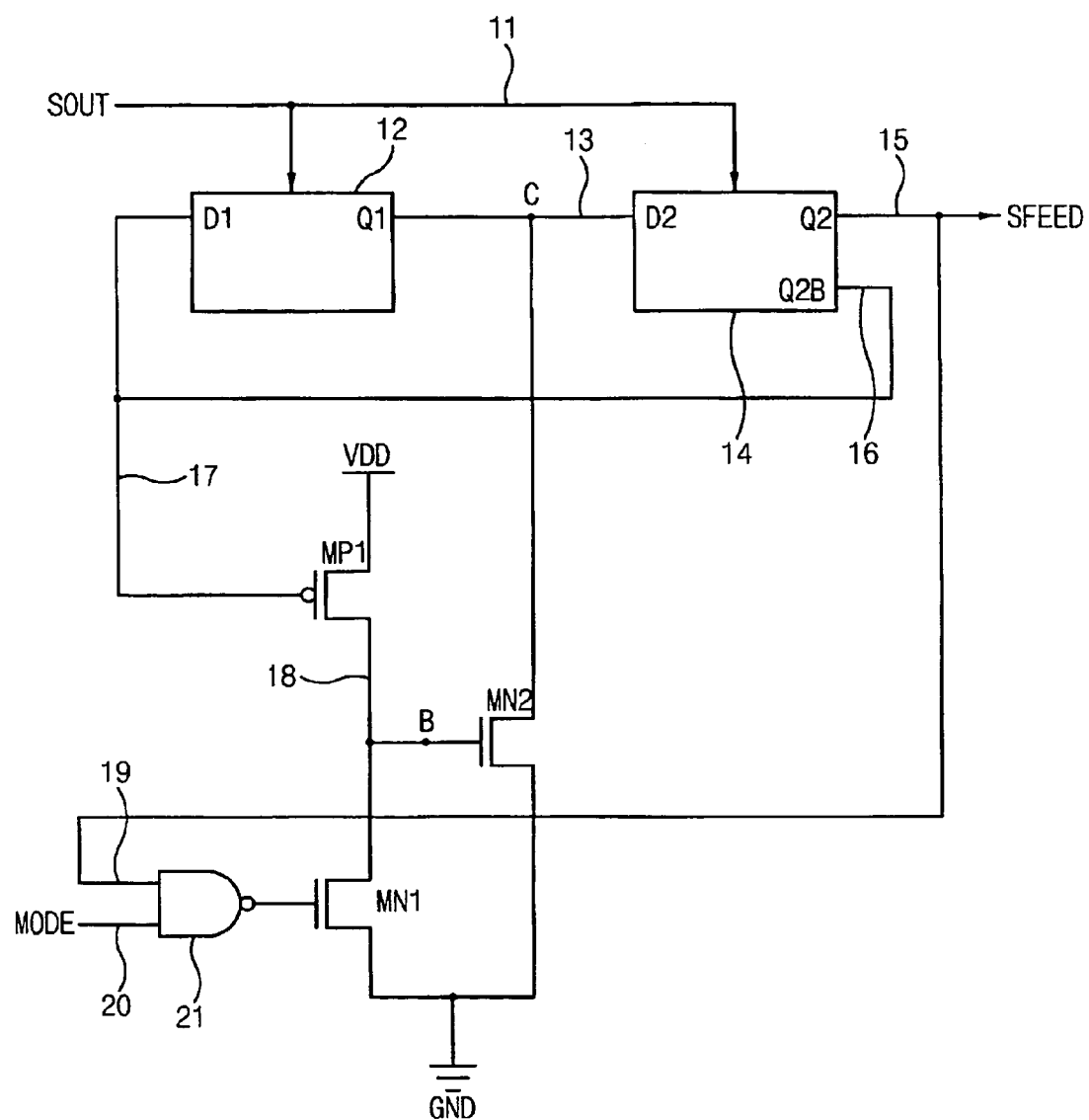
FIG. 2 is a circuit diagram illustrating a conventional dual modulus prescaler included in the frequency divider of FIG. 1.

Unlike the modulus prescaler shown in FIG. 2 that operates at a speed determined by the delay time of the NAND gate 21 and the NMOS transistors MN1 and MN2, the dual modulus prescaler shown in FIG. 3 operates at a higher speed largely determined by the transistor MN4.

The dual modulus prescaler shown in FIG. 3 employs two cascade connected transistors MN3 and MN4 rather than a logic circuit, e.g., the NAND gate 21 shown in FIG. 2, to speed up the operation.

Figure 5:
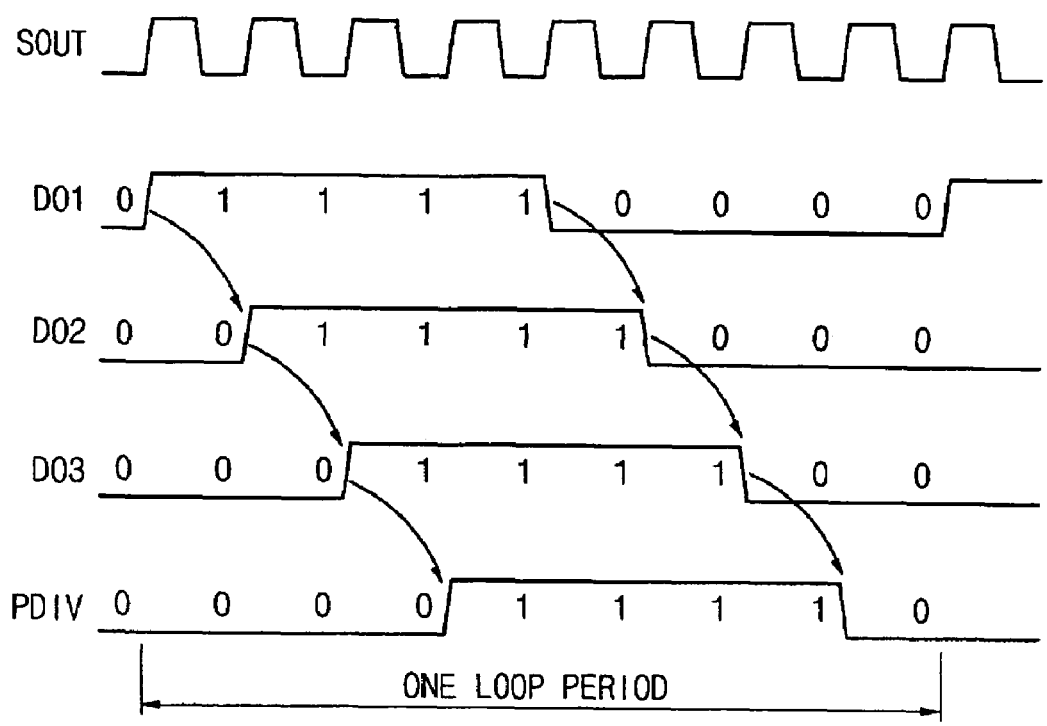
FIG. 5 is a timing diagram of the dual modulus prescaler shown in FIG. 4 when a control signal SCON has a low level.
Figure 6:
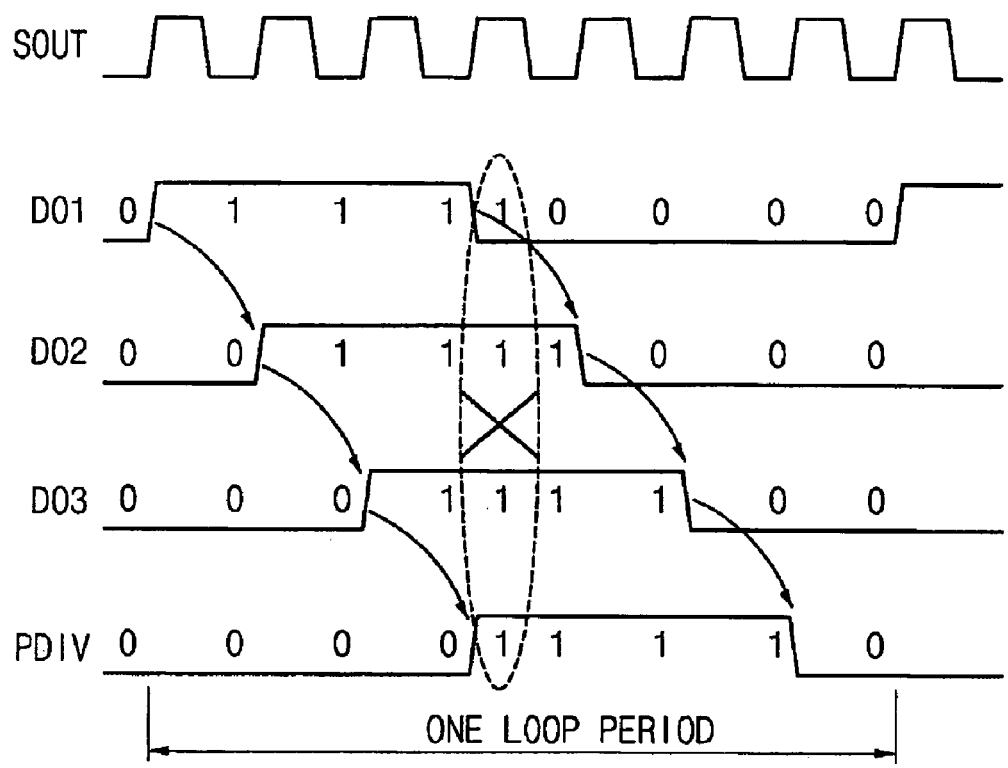
FIG. 6 is a timing diagram of the dual modulus prescaler shown in FIG. 4 when a control signal SCON has a high level.

FIG. 5 is a timing diagram of the dual modulus prescaler shown in FIG. 4 when a control signal SCON has a low level. FIG. 6 is a timing diagram of the dual modulus prescaler shown in FIG. 4 when a control signal SCON has a high level.

When the control signal SCON has a logic level '0', an exemplary operation of the dual modulus prescaler of FIG. 4 is as follows. When the control signal SCON has a logic level '0', the NMOS transistor MN3 is off. The frequency of the output signal PDIV of the dual modulus prescaler 520 is equal to ⅛ of the frequency of the VCO output signal SOUT as shown in the timing diagram of FIG. 5. That is, when the control signal SCON has a logic level '0', the frequency of the output signal of a dual modulus prescaler 520 having a frequency division unit with N D flip-flops is equal to 1/(2N) of the frequency of the VCO output signal SOUT.

Referring to FIG. 5, the output signal D01 of the first D flip-flop 522 changes from '0' to '1' at the first rising edge of the VCO output signal SOUT.

The output signal D01 is continuously maintained at '1' during the first four periods of the VCO output signal SOUT, and the output signal D01 changes from '1' to '0' after the first four periods of the VCO output signal SOUT. The output signal D01 is continuously maintained at '0' during the second four periods of the VCO output signal SOUT, and the output signal D01 changes from '0' from '1' at the 9th rising edge of the VCO output signal SOUT. And so on.

The output signal D02 of the second D flip-flop 523 changes at the second rising edge of the VCO output signal SOUT after the output signal D01 changes at the first rising edge of the VCO output signal SOUT.

The output signal D03 of the third D flip-flop 524 changes at the third rising edge of the VCO output signal SOUT after the output signal D02 changes at the second rising edge of the VCO output signal SOUT.

As a result, one loop period of the output signal PDIV of the fourth D-flip flop 525 is eight times a period (or a cycle) of the VCO output signal SOUT. That is, the frequency of the output signal PDIV of the dual modulus prescaler 520 is equal to ⅛ of the frequency of the VCO output signal SOUT.

As shown in FIG. 4, each of the D flip-flops shifts latched data to next stage D flip-flop on every SOUT clock cycle. Thus, output data D00, D01, D03, PDIV of each of the D flip-flops changes at a sequence '0000' '1000', '1100', '1110', '1111', '0111', '0011', '0001', '0000'. Since one loop period corresponds to eight clock cycles of the VCO output signal SOUT, the frequency of the output signal PDIV is equal to ⅛ of the frequency of the VCO output signal SOUT.

When the control signal has a logic level '1', an operation of the dual modulus prescaler of FIG. 4 is as follows. When the control signal SCON is '1', the NMOS transistor MN3 is on. The frequency of the output signal PDIV=D04 of the dual modulus prescaler 520 shown in FIG. 4 is equal to ⅐ of the frequency of the VCO output signal SOUT as shown in the timing diagram of FIG. 6. That is, the frequency of the output signal of a dual modulus prescaler 520 having a frequency division unit with N D flip-flops is equal to 1/(2N−1) of the frequency of the VCO output signal SOUT.

Referring to FIG. 6, the output signal D01 of the first D flip-flop 522 changes from '0' to '1' at the first rising edge of the VCO output signal SOUT.

The output signal D01 is continuously maintained at '1' during the first three periods of the VCO output signal SOUT, and the output signal D01 changes from '1' to '0' after the first three periods of the VCO output signal SOUT.

When the control signal SCON has a logic level '1', the output signal D01 of the first D flip-flop 522 has a different transition point compared with the output signal D01 when the control signal SCON is '0' as shown in FIG. 5.

The output signal D01 is continuously maintained at '0' during the second four periods of the VCO output signal SOUT, and the output signal D01 changes from '0' to '1' at the 8th rising edge of the VCO output signal SOUT.

The output signal D02 of the second D flip-flop 523 changes at the second rising edge of the VCO output signal SOUT after the output signal D01 of the first D flip-flop 522 changes at the first rising edge of the VCO output signal SOUT.

The output signal D03 of the third D flip-flop 524 changes at the third rising edge of the VCO output signal SOUT after the output signal D02 of the second D flip-flop 523 changes at the second rising edge of the VCO output signal SOUT.

As a result, one loop period of the output signal PDIV of the fourth D flip-flop 525 is seven times of the period of the VCO output signal SOUT. That is, the frequency of the output signal PDIV of the dual modulus prescaler 520 is equal to ⅐ of the frequency of the VCO output signal SOUT.

The operation of prescaler 520 shown in FIG. 6 is different from the operation of the prescaler 520 shown in FIG. 5 in that the output terminal of the first D flip-flop 522 is pulled down to a logic level '0' when the output terminal of the last D flip-flop 525 changes from '0' to '1' because the transistor MN4 is on due to the high level of the output terminal of the last D flip-flop 525. Thus, the output data D00, D01, D03, PDIV of the D flip-flops 522, 523, 524 and 525 changes at a sequence of '0000' '1000', '1100', '1110', '0111', '0011', '0001', '0000'. Namely, the output data D00, D01, D03, PDIV of the D flip-flops 522, 523, 524 and 525 changes from '0111' to '1110' without passing through '1111'. Since one loop period corresponds to seven clock cycles of the VCO output signal SOUT, the frequency of the output signal PDIV is equal to ⅐ of the frequency of the VCO output signal SOUT.

The gate of the NMOS transistor MN3 included in the frequency division ratio controller 526 receives the control signal SCON. And the gate of the NMOS transistor MN4 receives the output signal PDIV of the dual modulus prescaler 520. Alternatively, the gate of the NMOS transistor MN4 may receive the control signal SCON. And the gate of the NMOS transistor MN3 may receive the output signal PDIV of the dual modulus prescaler 520.

Figure 7:
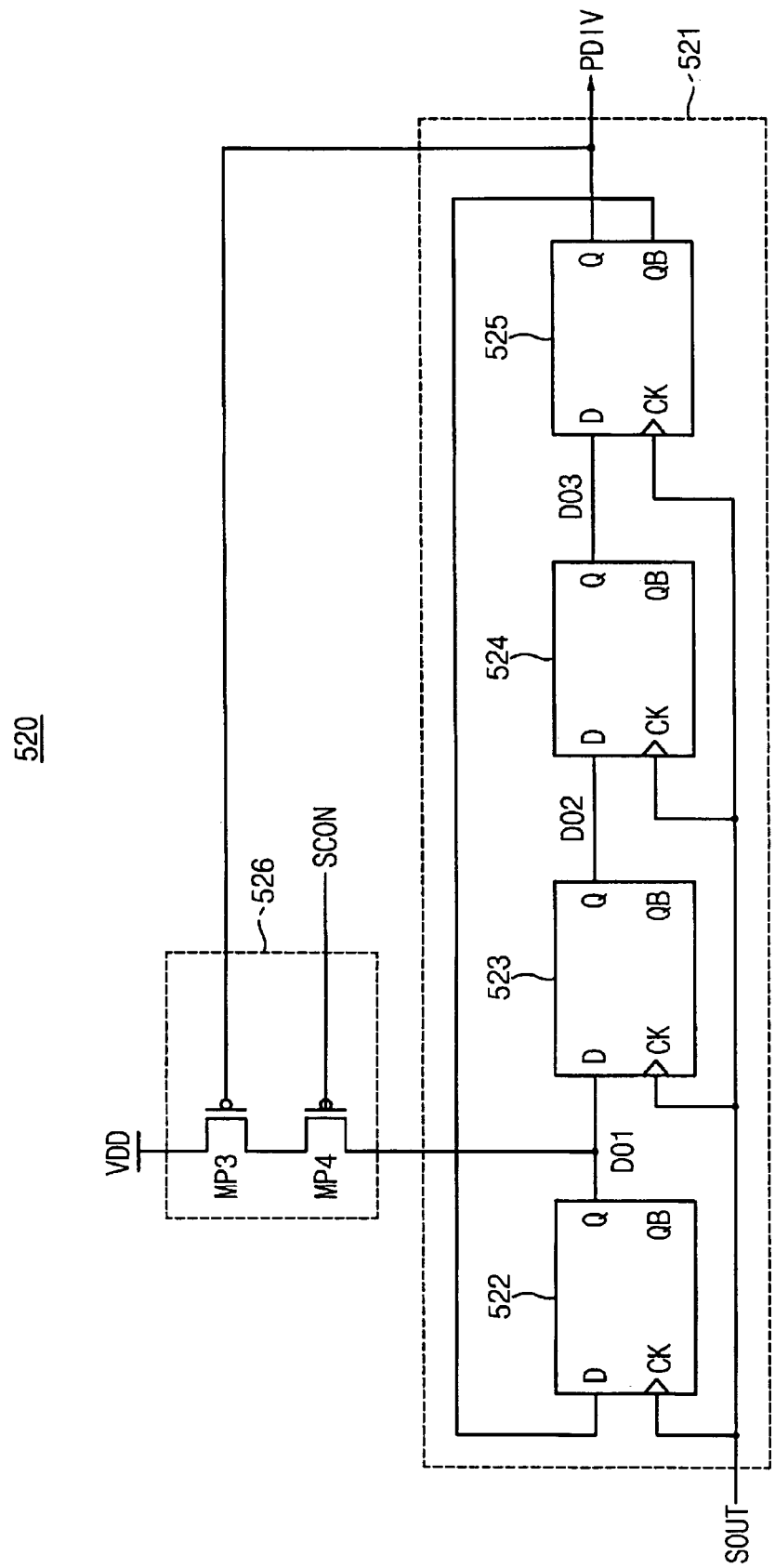
FIG. 7 is a circuit diagram illustrating a dual modulus prescaler included in the frequency divider of FIG. 3 according to another example embodiment of the present invention.

FIG. 7 is a circuit diagram of an embodiment of a dual modulus prescaler included in the frequency divider of FIG. 3.

A frequency division ratio controller 526 illustrated in FIG. 7 differs from the frequency division ratio controller 526 illustrated in FIG. 4 in that frequency division ratio controller 526 illustrated in FIG. 7 includes PMOS transistors rather than NMOS transistors.

Referring to FIG. 7, the frequency division ratio controller 526 includes serially connected PMOS transistors MP3 and MP4.

The PMOS transistor MP4 has a drain coupled to an output terminal Q of a first D flip-flop 522 and a gate for receiving a control signal SCON.

The PMOS transistor MP3 has a drain coupled to a source of the PMOS transistor MP4, a gate coupled to an output terminal Q of the fourth D flip-flop 525 and a source coupled to a power supply voltage VDD.

When the control signal SCON is '0', the PMOS transistor MP4 is on. When the control signal SCON is '1', the PMOS transistor MP4 is off.

An operation of the dual modulus prescaler illustrated in FIG. 7 is similar to that described earlier relative to the prescaler 520 shown in FIG. 4, and will not be described further.

The dual modulus prescaler shown in FIG. 7 has a time delay due to the transistor MP3. This time delay is an improvement to the time delay associated with other known dual modulus prescalers that include delays associated with the NAND gate 21 and the NMOS transistors MN1 and MN2.

The dual modulus prescaler according to an example embodiment of the present invention employs two serially connected transistors MP3 and MP4 rather than a logic circuit.

Accordingly, the frequency divider having the dual modulus prescaler according to the embodiments described are suitable for applying to a PLL system that operates at a high frequency such as a system running between 1 to 10 GHz.

While the example embodiments and their advantages have been described in detail, it should be understood that various changes, substitutions, and alterations may be made without departing from the scope and spirit of the claims.

I claim:

1. A dual modulus prescaler comprising:
   a frequency division unit to generate a prescaled signal by dividing a frequency of an input signal by a division ratio, where the division ratio is one of 2N and 2N−1, N is an integer, and the frequency division unit comprises N serially connected D flip-flops; and
   a frequency division ratio controller to determine the division ratio responsive to a count signal and the prescaled signal, the frequency division ratio controller comprising at least two serially connected transistors, where the count signal is connected to the gate of one of the transistors and the prescaled signal is connected to the gate of the other transistor, where the frequency division ratio controller performs a logical AND operation on the count signal and the prescaled signal.

2. The dual modulus prescaler of claim 1 where a voltage-controlled oscillator is adapted to generate the input signal.

3. The dual modulus prescaler of claim 1 where the input signal is adapted to clock the D flip-flops.

4. The dual modulus prescaler of claim 1 where the frequency division ratio controller comprises:
   a first NMOS transistor having a drain coupled to an output terminal of a first stage flip-flop in the frequency division unit and a gate to receive the count signal; and
   a second NMOS transistor having a drain coupled to a source of the first NMOS transistor, a gate to receive the prescaled signal, and a source coupled to a second power supply voltage.

5. The dual modulus prescaler of claim 1 where the frequency division ratio controller comprises:
   a first NMOS transistor having a drain coupled to an output terminal of a first stage flip-flop in the frequency division unit and a gate to receive the prescaled signal; and
   a second NMOS transistor having a drain coupled to a source of the first NMOS transistor, a gate to receive the count signal and a source coupled to a second power supply voltage.

6. The dual modulus prescaler of claim 1 where the frequency division ratio controller comprises:
   a first PMOS transistor having a drain coupled to an output terminal of a first stage flip-flop in the frequency division unit and a gate to receive the count signal; and
   a second PMOS transistor having a drain coupled to a source of the first PMOS transistor, a gate to receive the prescaled signal, and a source coupled to a first power supply voltage.

7. The dual modulus prescaler of claim 1 where the frequency division ratio controller comprises:
   a first PMOS transistor having a drain coupled to an output terminal of a first stage flip-flop in the frequency division unit and a gate to receive the prescaled signal; and
   a second PMOS transistor having a drain coupled to a source of the first PMOS transistor, a gate to receive the count signal, and a source coupled to a first power supply voltage.

8. The dual modulus prescaler of claim 1 where the count signal is generated responsive to the prescaled signal.

9. A frequency divider comprising:
   a dual modulus prescaler to generate a prescaled signal by scaling an input signal by a first division ratio responsive to a control signal and the prescaled signal, the dual modulus prescaler comprising:
      a frequency division unit to generate the prescaled signal by dividing a frequency of an input signal by the first division ratio; and
      a frequency division ratio controller to perform a logical AND operation on the control signal and the prescaled signal,
      where the first division ratio is one of either 2N or 2N−1, where N is an integer, and where the frequency division unit comprises N serially connected D flip-flops;
   a fixed division ratio scaler to generate a divided signal by dividing the prescaled signal by a second division ratio; and
   a control circuit to generate the control signal responsive to the prescaled signal.

10. The frequency divider of claim 9, where the control circuit includes a counter to count a number of clock pulses.

11. The frequency divider of claim 9 where the input signal corresponds to an output signal of a voltage-controlled oscillator.

12. The frequency divider of claim 9 where the input signal is adapted to clock the D flip-flops.

13. The frequency divider of claim 9 where the frequency division ratio controller comprises at least two serially connected transistors.

14. The frequency divider of claim 9 where the frequency division ratio controller comprises:
   a first NMOS transistor having a drain coupled to an output terminal of a first stage flip-flop in the frequency division unit and a gate to receive the control signal; and
   a second NMOS transistor having a drain coupled to a source of the first NMOS transistor, a gate to receive the prescaled signal, and a source coupled to a second power supply voltage.

15. The frequency divider of claim 9 where the frequency division ratio controller comprises:
   a first NMOS transistor having a drain coupled to an output terminal of a first stage flip-flop in the frequency division unit and a gate to receive the prescaled signal; and
   a second NMOS transistor having a drain coupled to a source of the first NMOS transistor, a gate to receive the control signal, and a source coupled to a second power supply voltage.

16. The frequency divider of claim 9 where the frequency division ratio controller comprises:
   a first PMOS transistor having a drain coupled to an output terminal of a first stage flip-flop in the frequency division unit and a gate to receive the control signal; and
   a second PMOS transistor having a drain coupled to a source of the first PMOS transistor, a gate to receive the prescaled signal, and a source coupled to a first power supply voltage.

17. The frequency divider of claim 9 where the frequency division ratio controller comprises:
   a first PMOS transistor having a drain coupled to an output terminal of a first stage flip-flop in the frequency division unit and a gate to receive the prescaled signal; and
   a second PMOS transistor having a drain coupled to a source of the first PMOS transistor, a gate to receive the control signal, and a source coupled to a first power supply voltage.

18. A prescaling method of a dual modulus prescaler comprising:
   dividing a frequency of an input signal by a division ratio of 2N or 2N−1 to output a prescaled signal, where N is an integer and dividing the frequency comprises applying the input signal to N serially connected D flip-flops; and
   determining the division ratio responsive to a count signal and the prescaled signal, where determining the division ratio comprises applying the count signal and the prescaled signal to at least two serially connected transistors and performing a logical AND operation on the count signal and the prescaled signal.

19. The method of claim 18 where the input signal corresponds to an output signal of a voltage-controlled oscillator.

20. A frequency dividing method comprising:
   dividing a frequency of an input signal by a first division ratio of one of 2N and 2N−1, where N is an integer, responsive to a control signal and a prescaled signal, where the control signal and the prescaled signal are connected to the gates of at least two serially connected transistors, the division ratio is determined by performing a logical AND operation on the control signal and the prescaled signal, and the input signal is applied to N serially connected D flip-flops;
   dividing the prescaled signal by a second division ratio to output the divided signal; and
   changing a state of the control signal after a predetermined number of clock pulses are generated responsive to the prescaled signal.

* * * * *